(12) United States Patent
Sera et al.

(10) Patent No.: US 7,939,229 B2
(45) Date of Patent: May 10, 2011

(54) PHOTOMASK, SEMICONDUCTOR DEVICE, AND METHOD FOR MANUFACTURING SEMICONDUCTOR DEVICE

(75) Inventors: Hiroshi Sera, Chino (JP); Takashi Miyata, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 177 days.

(21) Appl. No.: 12/244,284

(22) Filed: Oct. 2, 2008

(65) Prior Publication Data

US 2009/0127596 A1 May 21, 2009

(30) Foreign Application Priority Data

Nov. 19, 2007 (JP) ................................. 2007-298921

(51) Int. Cl.
*G03F 1/00* (2006.01)
*G03F 7/00* (2006.01)
(52) U.S. Cl. .......................................... 430/5; 430/311
(58) Field of Classification Search ...... 430/5, 311–313; 438/149, 155
See application file for complete search history.

(56) References Cited

U.S. PATENT DOCUMENTS

| 6,284,416 | B1 * | 9/2001 | Shiraishi et al. | 430/5 |
|---|---|---|---|---|
| 6,703,168 | B1 * | 3/2004 | Misaka | 430/5 |
| 6,803,155 | B2 * | 10/2004 | Dulman et al. | 430/5 |
| 2002/0177050 | A1 * | 11/2002 | Tanaka | 430/5 |
| 2005/0042528 | A1 * | 2/2005 | Imai et al. | 430/5 |
| 2005/0077516 | A1 * | 4/2005 | Lim et al. | 257/59 |
| 2005/0250050 | A1 * | 11/2005 | Chen et al. | 430/313 |
| 2007/0037070 | A1 * | 2/2007 | Ohnuma et al. | 430/5 |
| 2009/0111251 | A1 * | 4/2009 | Miyata | 438/514 |

FOREIGN PATENT DOCUMENTS

JP    A-2006-054424    2/2006

* cited by examiner

*Primary Examiner* — Stephen Rosasco
*Assistant Examiner* — Stewart A Fraser
(74) *Attorney, Agent, or Firm* — Oliff & Berridge, PLC

(57) ABSTRACT

A photomask includes a light-blocking section that blocks light and also includes a light intensity difference section that controls the intensity of light. The light-blocking section is disposed between the light intensity difference section and a light-transmissive region transmitting light.

9 Claims, 7 Drawing Sheets

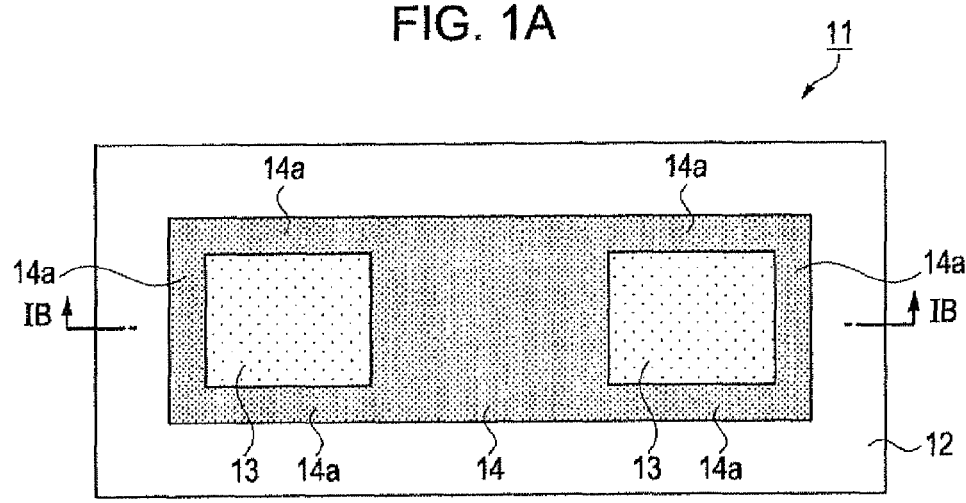
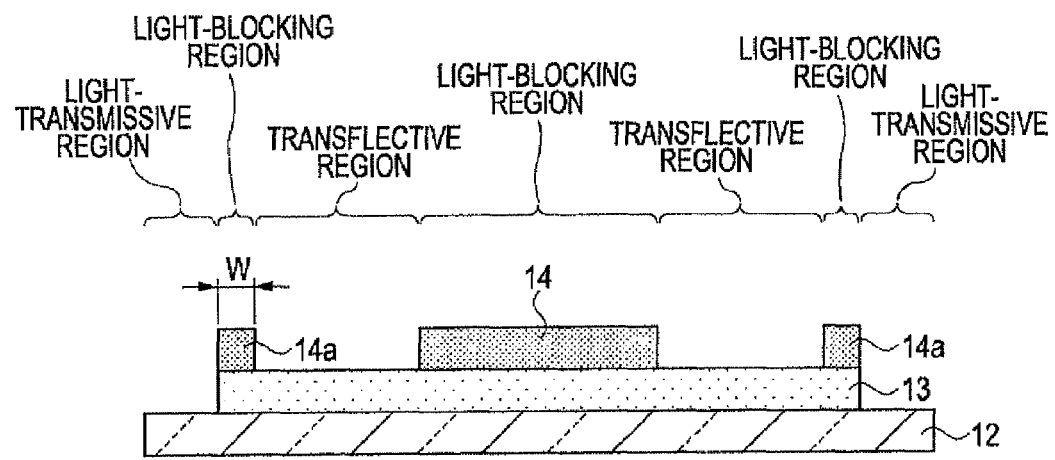

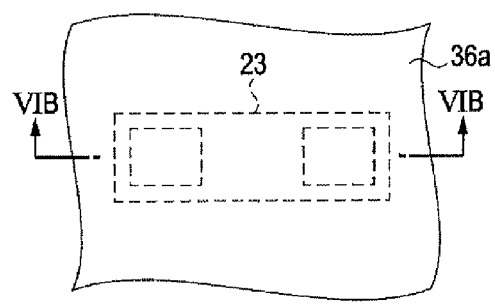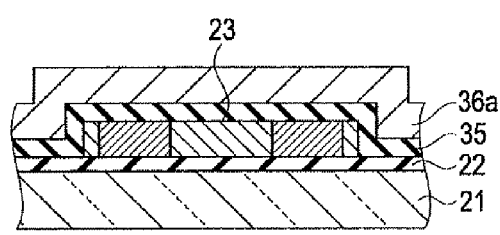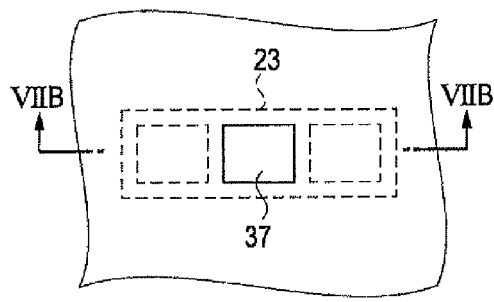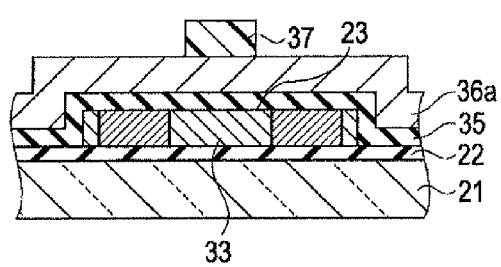

PHOTOMASK, SEMICONDUCTOR DEVICE, AND METHOD FOR MANUFACTURING SEMICONDUCTOR DEVICE

BACKGROUND

1. Technical Field

The present invention relates to a photomask having a halftone region, a semiconductor device manufactured using the photomask, and a method for manufacturing the semiconductor device.

2. Related Art

A semiconductor device is manufactured by the following procedure: for example, a semiconductor layer is formed on a substrate and a resist layer is formed on the semiconductor layer and then processed using a halftone photomask so as to have steps as described in JP-A-2006-54424.

In particular, the photomask has a light-blocking region completely blocking light, a transflective region reducing the intensity of light, and a light-transmissive region transmitting light. The resist layer is exposed to light through the photomask, whereby the following portions are formed in the resist layer: a thick portion corresponding to a channel region and thin portions each corresponding to a source region or a drain region.

The semiconductor layer is patterned using the stepped resist layer as a mask, whereby the source and drain regions are formed in the semiconductor layer so as to have a small thickness. The source and drain regions are doped with an impurity by making use of the difference in thickness between the thick and thin portions of the resist layer.

When the resist layer is processed so as to be stepped, light leaking from the light-transmissive region or reflected by a surrounding portion enters the transflective region, which has a small thickness. Hence, a thin boundary zone of the resist layer that corresponds to the boundary between the transflective region and the light-transmissive region is exposed to light with an intensity greater than that of regular light. In other words, it is difficult to control the intensity of light applied to the boundary zone. Therefore, when the resist layer is developed, an extra portion is removed from the boundary zone. This reduces the uniformity of the line width and thickness of the resist layer. Therefore, if a semiconductor layer 101 is etched using the resist layer as a mask as shown in FIG. 11, the uniformity of the line width 111 (the distance from a source region 112 to a drain region 113) of the semiconductor layer 101 is reduced and therefore an etching margin is small. This causes a problem in that a semiconductor element has low dielectric strength.

Furthermore, the semiconductor layer 101 has thin boundary zones K disposed between the transflective region and the light-transmissive region; hence, a portion X that should not be heavily doped with any impurity is heavily doped with an impurity. Therefore, even if an LDD structure is formed, there is a problem in that the LDD structure malfunctions because the portion X heavily doped with the impurity is in contact with a channel region 114.

SUMMARY

An advantage of an aspect of the invention provides a photomask. The photomask includes a light-blocking section that blocks light and also includes a light intensity difference section that controls the intensity of light. The light-blocking section is disposed between the light intensity difference section and a light-transmissive region transmitting light.

Since the light-blocking section is disposed between the light intensity difference section and the light-transmissive region, light leaking from or reflected by the light-transmissive region can be absorbed by a portion of a resist layer that corresponds to the light-blocking section when the resist layer is exposed to light through the photomask. In other words, unnecessary light can be prevented from entering a portion of the resist layer that corresponds to the light intensity difference section. Therefore, the portion of the resist layer that corresponds to the light intensity difference section can be subjected to light exposure without varying the intensity of light and therefore can be patterned so as to provide a regular line width. This allows a semiconductor layer, which is located under the resist layer and is patterned using the resist layer as a mask, to have a regular width and a regular margin, thereby securing the dielectric strength of a semiconductor element. The resist layer is capable of providing a uniform line width; hence, an impurity can be implanted into a regular portion of the semiconductor layer such that an LDD structure is formed. The light-blocking section covers a necessary portion only, which leads to a reduction in manufacturing cost.

An advantage of another aspect of the invention provides a photomask. The photomask includes a light-blocking section that blocks light and also includes a light intensity difference section that controls the intensity of light. The light-blocking section extends along the periphery of the light intensity difference section.

Since the light-blocking section extends along the periphery of the light intensity difference section, unnecessary light can be prevented from entering a portion of a resist layer that corresponds to the light intensity difference section even if light leaks from or is reflected by the light-transmissive region. Therefore, the portion of the resist layer that corresponds to the light intensity difference section can be subjected to light exposure without varying the intensity of light; hence, a semiconductor layer located under the resist layer can be patterned using the resist layer as a mask so as to have a regular line width.

In the photomask, the light-blocking section extending along the periphery of the light intensity difference section preferably has a width of 0.10 to 1.00 μm in plan view.

Since the width of the light-blocking section extending along the periphery of the light intensity difference section is set as described above, a resist layer can be patterned so as to have a line width substantially equal to the above width in such a manner that the resist layer is exposed to light through the photomask.

In the photomask, the light intensity difference section is preferably halftone.

According to this configuration, the intensity of exposure light can be reduced in such a manner that a predetermined film is formed on the light intensity difference section of the photomask using a material different from that used to form the light-blocking section.

In the photomask, the light intensity difference section preferably has a plurality of slits.

Since the light intensity difference section of the photomask has the slits, the intensity of exposure light can be reduced.

An advantage of another aspect of the invention provides a semiconductor device manufactured using the photomask. The semiconductor device includes a semiconductor layer disposed on a substrate, a source region formed by heavily implanting an impurity into a portion of the semiconductor layer, and a drain region formed by heavily implanting the impurity into a portion of the semiconductor layer. The semiconductor layer has a region which extends around the source and drain regions and which is undoped with the impurity. The concentration of the impurity decreases from substantially the center of each of the source and drain regions toward the periphery thereof.

Since the semiconductor layer has the undoped region and the concentration of the impurity decreases from substantially the center of each of the source and drain regions toward the periphery thereof, the impurity can be prevented from contacting a channel region and therefore the LDD structure can be formed.

In the semiconductor device, the source and drain regions are preferably surrounded by circular regions depending on the difference in impurity concentration.

Since the source and drain regions are surrounded by the circular regions depending on the difference in impurity concentration, a large number of undoped regions can be formed between a channel region and a heavily doped region. Therefore, the LDD structure can be readily formed.

An advantage of another aspect of the invention provides a method for manufacturing a semiconductor device using the photomask. The method includes a step of forming a semiconductor layer on a substrate; a step of forming a resist precursor layer on the semiconductor layer; a step of irradiating the resist precursor layer with exposure light through the photomask placed above the resist precursor layer; a step of developing the resist precursor layer into a resist layer; and a step of processing the semiconductor layer using the resist layer.

According to this method, the semiconductor device is manufactured using the photomask; hence, the semiconductor layer can be patterned so as to have a regular line width. This is effective in securing the dielectric strength of a semiconductor element and allows the LDD structure to well function.

BRIEF DESCRIPTION OF THE DRAWINGS

The invention will be described with reference to the accompanying drawings, wherein like numbers reference like elements.

FIG. 1A is a schematic plan view of a photomask according to an embodiment of the present invention.

FIG. 1B is a schematic sectional view of the photomask taken along the line IB-IB.

FIG. 6A is a schematic plan view showing a step of the method.

FIG. 6B is a schematic sectional view taken along the line VIB-VIB of FIG. 6A.

FIG. 7A is a schematic plan view showing a step of the method.

FIG. 7B is a schematic sectional view taken along the line VIIB-VIIB of FIG. 7A.

DESCRIPTION OF EXEMPLARY EMBODIMENTS

FIG. 1A is a schematic plan view of a photomask 11 according to an embodiment of the present invention. FIG. 1B is a schematic sectional view of the photomask 11 taken along the line IB-IB. The configuration of the photomask 11 will now be described with reference to FIGS. 1A and 1B.

With reference to FIGS. 1A and 1B, the photomask 11 includes a mask substrate 12, a transflective layer 13 serving as a light intensity difference section adjusting the transmittance of exposure light emitted from a exposure system (not shown), and a light-blocking layer 14 serving as a light-blocking section that substantially completely blocks light. The photomask 11 is hereinafter referred to as "halftone mask 11". The mask substrate 12 is made of a transparent material such as glass.

The transflective layer 13 is disposed on the mask substrate 12 and is made of tantalum oxide (TaO), chromium oxide (CrO), or the like. The transflective layer 13 can be controlled in transmittance (shade) by adjusting, for example, the thickness thereof. That is, the intensity of light passing through the transflective layer 13 can be reduced. The transmittance of the transflective layer 13 can be set to, for example, 50% in such a manner that the thickness of the transflective layer 13 is adjusted to a predetermined value. The transmittance of the transflective layer 13 can be controlled to be greater than 50% in such a manner that the thickness of the transflective layer 13 is reduced to a value less than such a predetermined value. The transmittance of the transflective layer 13 is not limited to 50% and may be an intermediate between that of the mask substrate 12 and that of the light-blocking layer 14.

Figure 5A:
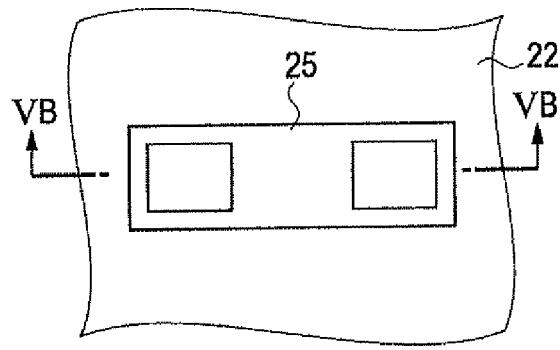
FIG. 5A is a schematic plan view showing a step of the method.
Figure 5B:
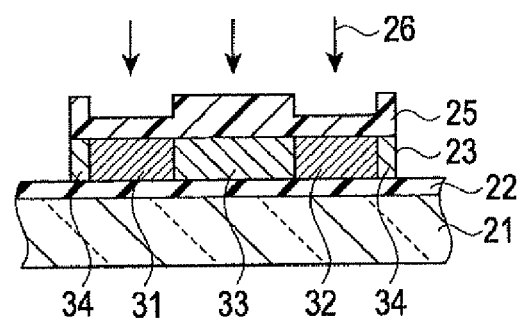
FIG. 5B is a schematic sectional view taken along the line VB-VB of FIG. 5A.

The light-blocking layer 14 has a region corresponding to a channel region 33 present in a semiconductor layer as shown in FIG. 5B and also has a region extending along the periphery of the transflective layer 13. That is, the halftone mask 11 has transflective regions, a light-transmissive region, and a light-blocking region (a light-blocking layer portion 14a) which is located between the light-transmissive region and the transflective regions such that the light-transmissive region is separated from the transflective regions. The light-blocking layer 14 is made of, for example, chromium (Cr).

In particular, the light-blocking region of the halftone mask 11 is an area where the transflective layer 13 and the light-blocking layer 14 overlap. The transflective regions are areas where the transflective layer 13 is exposed from the light-blocking layer 14. When the halftone mask 11 is irradiated with exposure light, a portion of the exposure light that is applied to the light-blocking layer 14 does not pass through the halftone mask 11. A portion of the exposure light that is applied to the transflective layer 13 passes through the halftone mask 11 to be reduced in intensity.

The light-blocking layer portion 14a is located around the transflective regions and has a width of, for example, 0.10 to 1.00 μm such that a resist layer can be resolved. If the width of the light-blocking layer portion 14a is set to such a value, the resist layer can be patterned so as to have a desired line width.

FIGS. 2A to 8A are schematic plan views showing steps of a method for manufacturing a semiconductor device 41. FIGS. 2B to 8B are schematic sectional views taken along the lines IIB-IIB to VIIIB-VIIIB, respectively, of FIGS. 2A to 8A. The manufacturing method will now be described with reference to FIGS. 2A to 8A and 2B to 8B. In this embodiment, the semiconductor device 41 is, for example, an n-channel type TFT having an LDD structure.

Figure 2A:
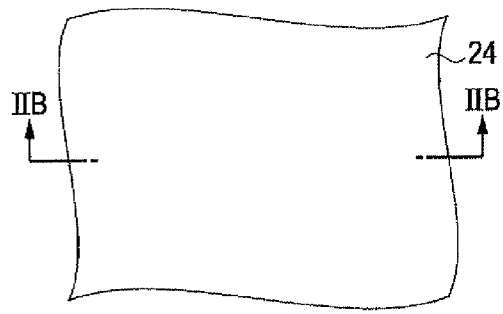
FIG. 2A is a schematic plan view showing a step of a method for manufacturing a semiconductor device.
Figure 2B:
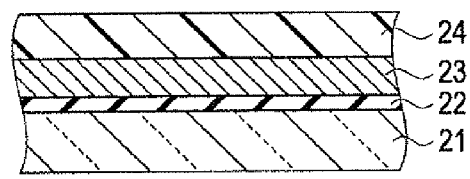
FIG. 2B is a schematic sectional view taken along the line IIB-IIB of FIG. 2A.

As shown in FIGS. 2A and 2B, a base protective layer 22 made of silicon oxide or the like is deposited on a substrate 21 made of glass or the like by, for example, a plasma-enhanced chemical vapor deposition (PECVD) process. A semiconductor layer 23 made of polycrystalline silicon or the like is deposited over the base protective layer 22. A resist precursor layer 24 for forming a first resist layer 25 is deposited on the semiconductor layer 23. The resist precursor layer 24 is, for example, a positive type and therefore is partly removed by development depending on the dose of exposure light applied thereto.

Figure 3A:
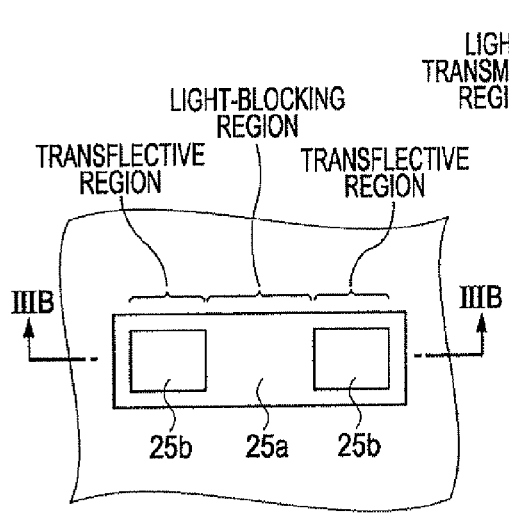
FIG. 3A is a schematic plan view showing a step of the method.
Figure 3B:
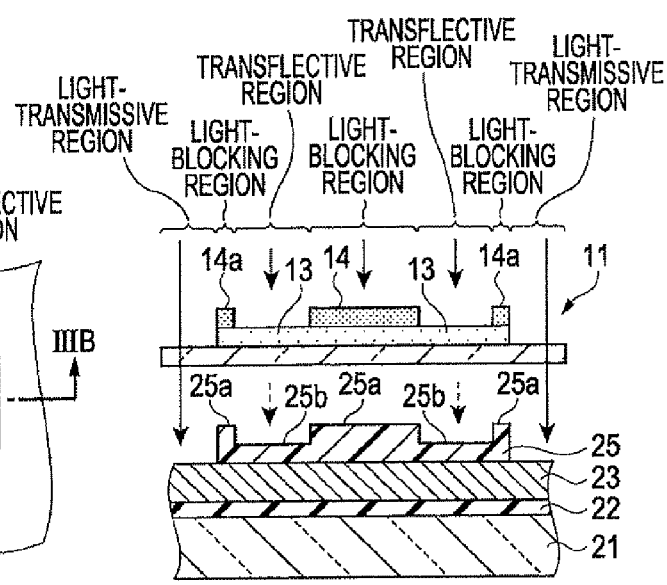
FIG. 3B is a schematic sectional view taken along the line IIIB-IIIB of FIG. 3A.

As shown in FIGS. 3A and 3B, the resist precursor layer 24 is patterned by a photolithographic process. In the photolithographic process, the halftone mask 11 is used to expose the resist precursor layer 24 to light.

In particular, the resist precursor layer 24 is irradiated with exposure light through the halftone mask 11. A portion of the exposure light that is applied to the light-blocking layer 14 of the halftone mask 11 cannot pass through the light-blocking layer 14 and is blocked. A portion of the exposure light that is applied to the transflective layer 13 passes through the transflective layer 13 to be reduced in intensity depending on the transmittance of the transflective layer 13 and is then incident on the resist precursor layer 24. A portion of the exposure light that is applied to a region other than the light-blocking layer 14 or the transflective layer 13 passes through this region without being reduced in intensity.

The resulting resist precursor layer 24 is developed into the first resist layer 25. The first resist layer 25 includes a first section 25a which has a thickness substantially equal to that of the resist precursor layer 24 and which corresponds to the light-blocking region and also includes second sections 25b which have a thickness less than that of the resist precursor layer 24 and which correspond to the transflective regions. That is, the first resist layer 25 is stepped. The second sections 25b, which are located at end portions of the first resist layer 25, are not as thick as the first section 25a, which is located at substantially a center portion of the first resist layer 25 because of light reflected by the light-transmissive region. A portion of the resist precursor layer 24 that is located under the light-transmissive region is entirely removed.

The first section 25a of the first resist layer 25 has a thickness of, for example, 1 μm. The second sections 25b of the first resist layer 25 have a thickness of, for example, 0.4 μm.

In the halftone mask 11, the periphery of the transflective layer 13 is covered with the light-blocking layer 14; hence, the first section 25a of the first resist layer 25, which is formed using the halftone mask 11, can be formed between the transflective regions so as to have a large thickness. The first section 25a absorbs light leaking from or reflected by the light-transmissive region and therefore portions of the resist precursor layer 24 that are located under the transflective regions can be processed so as to have a regular shape and a uniform thickness. This prevents the second sections 25b of the first resist layer 25 from being varied in line width.

Figure 4A:
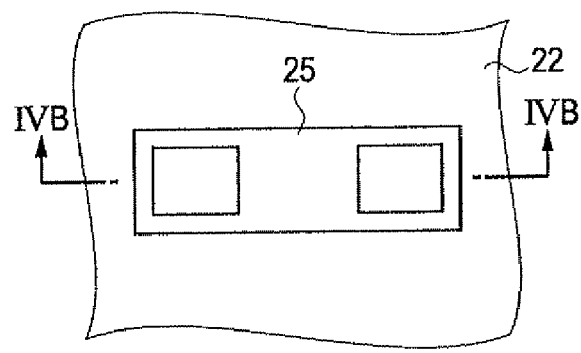
FIG. 4A is a schematic plan view showing a step of the method.
Figure 4B:
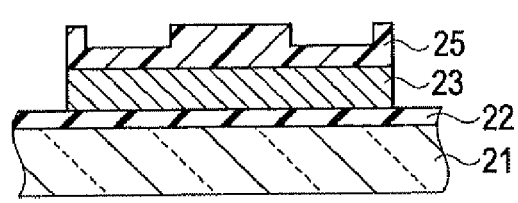
FIG. 4B is a schematic sectional view taken along the line IVB-IVB of FIG. 4A.

As shown in FIGS. 4A and 4B, the semiconductor layer 23, which is located under the first resist layer 25 patterned to be stepped, is etched using the first resist layer 25 as a mask. The resulting semiconductor layer 23 has a pattern for forming the channel region 33, a source region 31, and a drain region 32 as shown in FIG. 5B. Examples of an etching process used include a dry etching process and a wet etching process.

The first resist layer 25 has a predetermined uniform line width and the semiconductor layer 23 is patterned using the first resist layer 25; hence, an etching margin can be secured. This is effective in securing the dielectric strength of an obtained semiconductor element 45 shown in FIG. 5B.

An outer region 34 corresponding to the light-blocking layer 14 of the halftone mask 11 is formed outside the source region 31 and the drain region 32 as shown in FIG. 5B; hence, an etching process is allowed to have a margin. Furthermore, the first resist layer 25 has a regular line width; hence, the shape of the semiconductor layer 23 is allowed to have a margin.

As shown in FIGS. 5A and 5B, first impurity ions 26 such as phosphorus ions are heavily implanted into the semiconductor layer 23 at a dose of, for example, $0.1 \times 10^{15}$ to $10 \times 10^{15}$ cm$^{-2}$ using the first resist layer 25 as a mask. This allows a large number of the first impurity ions 26 to pass through the second sections 25b of the first resist layer 25 because the second sections 25b have a small thickness, so that the first impurity ions 26 are heavily implanted into the semiconductor layer 23.

The source region 31 and the drain region 32 are formed in the semiconductor layer 23 by the above procedure. An area disposed between the source region 31 and the drain region 32 is the channel region 33. The transflective regions are preferably set in consideration of the light-blocking layer portion 14a such that the source region 31 and the drain region 32 are prevented from being narrowed due to the outer region 34, which corresponds to the light-blocking layer portion 14a extending along the periphery of the halftone mask 11.

As described above, the source region 31 (a source-side heavily doped region 31a later) and the drain region 32 (a drain-side heavily doped region 32a later) can be formed in the semiconductor layer 23 in a self-aligned manner using the first resist layer 25 as a mask. The first impurity ions 26 are trapped in the first section 25a, which has a large thickness, and therefore do not reach the channel region 33. That is, the channel region 33 is prevented from being doped with the first impurity ions 26. The semiconductor layer 23 may be etched subsequently to the implantation of the first impurity ions 26.

As shown in FIGS. 6A and 6B, after the first resist layer 25 is removed from the semiconductor layer 23, a gate insulating layer 35 made of silicon oxide or the like is deposited over the semiconductor layer 23 and the substrate 21 by a PECVD process, a sputtering process, or a similar process. A conductive layer 36a, made of polycrystalline silicon or the like, for forming a gate electrode 36 is deposited over the gate insulating layer 35.

When the first resist layer 25 is removed, the source region 31 and drain region 32 of the semiconductor layer 23 may be reduced in thickness because the second sections 25b of the first resist layer 25 have a small thickness and therefore are primarily removed and the source region 31 and drain region 32 are located under the second sections 25b thereof. The reduction in the thickness of the source and drain regions 31 and 32 allows a slope to be formed around the source and drain regions 31 and 32. The slope is effective in securing the thickness of the gate insulating layer 35, which is formed on the semiconductor layer 23 as described above. This is effective in securing the dielectric strength of the semiconductor element 45.

As shown in FIGS. 7A and 7B, a second resist layer 37 is formed over the conductive layer 36a and then patterned by a photolithographic process so as to have a predetermined shape in such a manner that the second resist layer 37 is exposed to light and then developed. The patterned second resist layer 37 has a width less than that of the channel region 33, which is located under the second resist layer 37, and is aligned with the channel region 33 such that both end portions of the channel region 33 can be converted into a source-side lightly doped region 31b and a drain-side lightly doped region 32b as shown in FIG. 8B.

Figure 8A:
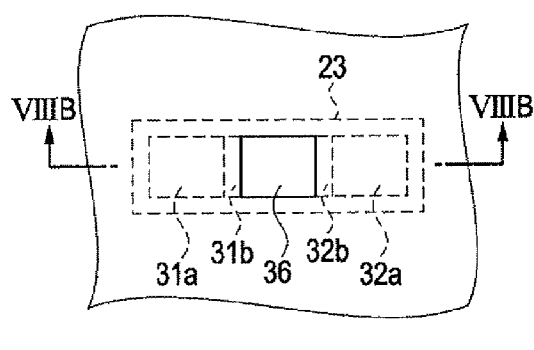
FIG. 8A is a schematic plan view showing a step of the method.
Figure 8B:
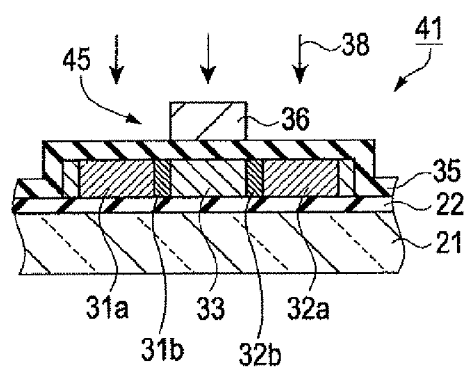
FIG. 8B is a schematic sectional view taken along the line VIIIB-VIIIB of FIG. 8A.

As shown in FIGS. 8A and 8B, the conductive layer 36a is etched using the patterned second resist layer 37 as a mask, whereby the gate electrode 36 is formed. Second impurity ions 38 such as phosphorus ions are lightly implanted into the semiconductor layer 23 at a dose of, for example, $0.1 \times 10^{13}$ to $10 \times 10^{13}$ cm$^{-2}$ using the patterned second resist layer 37 as a mask, whereby both end portions of the channel region 33 are converted into the source-side lightly doped region 31b and the drain-side lightly doped region 32b. This completes the semiconductor device 41, which has a so-called LDD structure.

Figure 9:
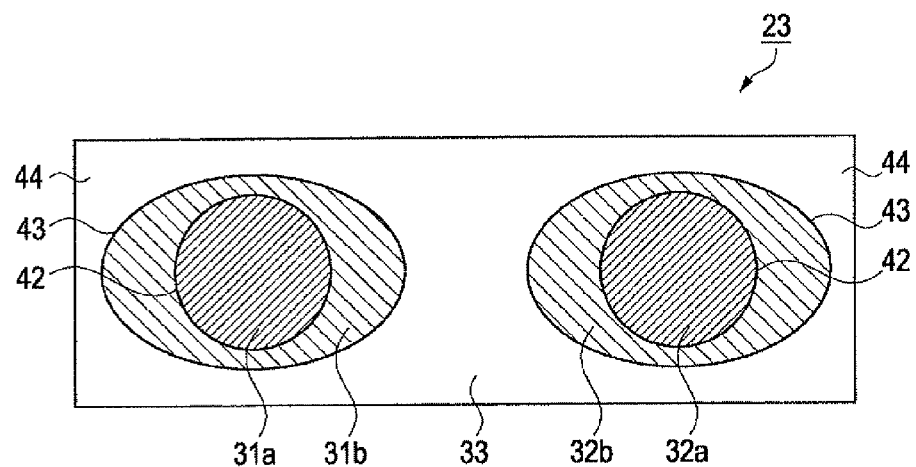
FIG. 9 is schematic plan view of the semiconductor layer shown in FIG. 8A.

FIG. 9 is schematic plan view of the semiconductor layer 23 shown in FIG. 8A. The configuration of the semiconductor layer 23 is described below with reference to FIG. 9.

As shown in FIG. 9, the semiconductor layer 23 includes the channel region 33, the source region 31 (31a and 31b), and the drain region 32 (32a and 32b).

The impurity concentration of the source and drain regions 31 and 32 peaks at substantially the center of each of the source and drain regions 31 and 32 and gradually decreases toward the periphery thereof. In the halftone mask 11, the light-blocking layer 14 surrounds the transflective regions, which correspond to the source and drain regions 31 and 32; hence, a portion of the first resist layer 25 that corresponds to the light-blocking layer 14 is thick. The first resist layer 25 gradually thins inward from the thick portion. If an impurity is implanted into the semiconductor layer 23 through the first resist layer 25, the following regions can be formed in the semiconductor layer 23: a heavily doped region 42 having the highest impurity concentration, a lightly doped region 43 having an impurity concentration less than that of the heavily doped region 42, and a region 44 undoped with the impurity.

The impurity concentration varies from substantially the center of each of the source and drain regions 31 and 32 in substantially a circular pattern. That is, the impurity concentration decreases toward the periphery of each of the source and drain regions 31 and 32. Therefore, after the gate electrode 36 is formed, both end portions of the channel region 33 can be converted into the source-side lightly doped region 31b and the drain-side lightly doped region 32b. That is, the channel region 33 can be prevented from being in contact with the source-side heavily doped region 31a and the drain-side heavily doped region 32a, This allows the LDD structure to well function.

According to this embodiment described above in detail, advantages below can be achieved.

(1) Since the light-blocking layer portion 14a extends along the periphery of the transflective layer 13, light leaking from or reflected by the light-transmissive region can be absorbed by the first section 25a of the first resist layer 25 that corresponds to the light-blocking layer 14 when the resist precursor layer 24 is exposed to light through the halftone mask 11. In other words, unnecessary light can be prevented from entering the transflective regions of the first resist layer 25. Therefore, the second sections 25b of the first resist layer 25 that correspond to the transflective regions can be subjected to light exposure without varying the intensity of light and therefore can be patterned so as to provide a regular line width. This allows the semiconductor layer 23, which is located under the first resist layer 25 and is patterned using the first resist layer 25 as a mask, to have a regular width and a regular margin, thereby securing the dielectric strength of the semiconductor element 45.

(2) Since the halftone mask 11 has the light-blocking layer portion 14a, the periphery of the first resist layer 25 can be prevented from being reduced in thickness when the resist precursor layer 24 is exposed to light through the halftone mask 11. Therefore, an impurity can be implanted into, for example, a regular portion o f the semiconductor layer 23 at a predetermined dose such that the LDD structure is formed.

(3) Since the outer region 34, which corresponds to the light-blocking layer 14, is located around the second sections 25b of the first resist layer 25, the semiconductor layer 23 can be patterned by etching using the first resist layer 25 as a mask so as to have a margin. This is effective in securing the dielectric strength of the semiconductor element 45.

The present invention is not limited to this embodiment and variations below may be made.

First Variation

Figure 10A:
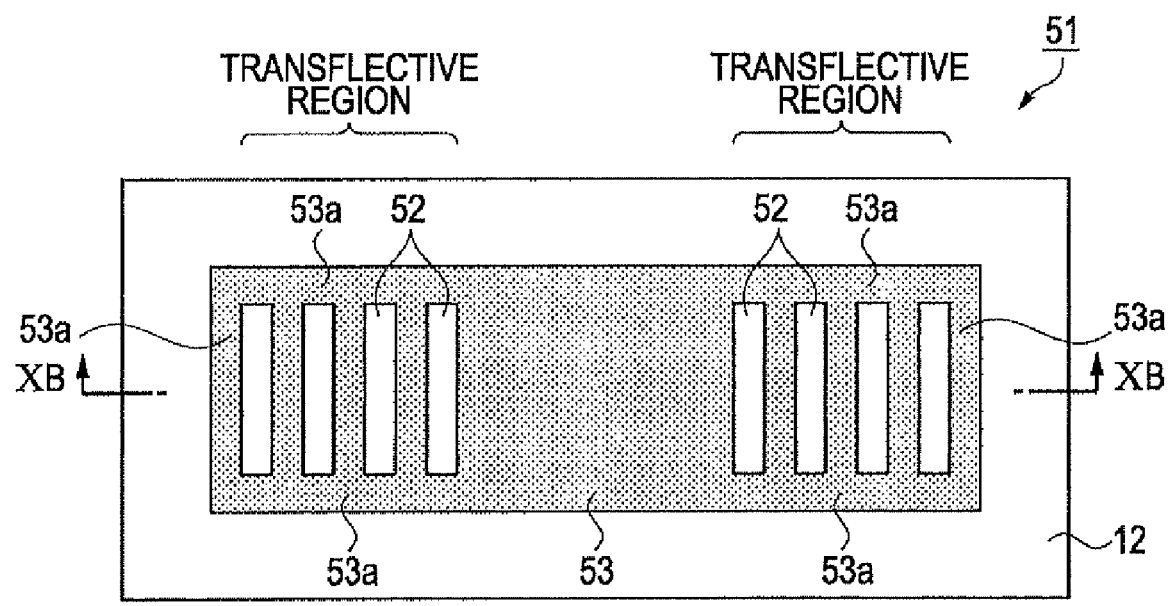
FIG. 10A is a schematic plan view of a slit mask according to a first variation.
Figure 10B:
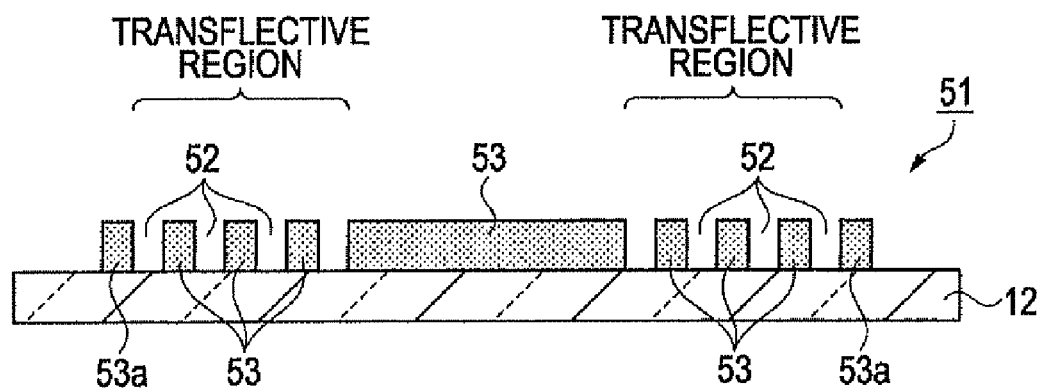
FIG. 10B is a schematic sectional view of the slit mask taken along the line XB-XB of FIG. 10A.
Figure 11:
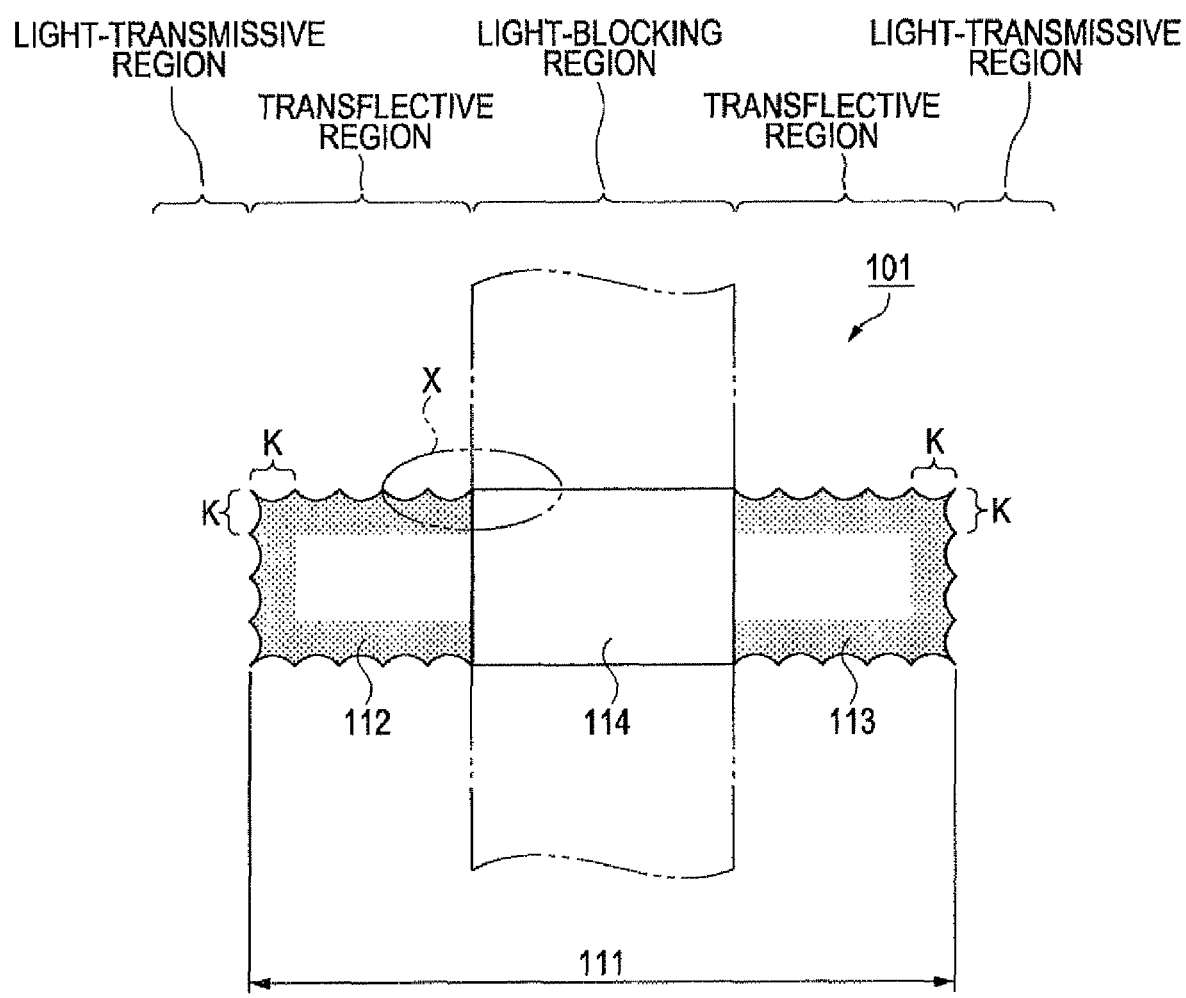
FIG. 11 is a schematic plan view of a conventional semiconductor device.

A photomask used herein is not limited to the halftone mask 11 according to the above embodiment and may be a multi-tone mask or a slit mask (gray tone mask) having a slit. FIG. 10A is a schematic plan view of a slit mask 51. FIG. 10B is a schematic sectional view of the slit mask 51 taken along the line XB-XB of FIG. 10A. The slit mask 51 includes a light-blocking layer 53 having opening portions (slits) 52 disposed in areas corresponding to transflective regions. The slit mask 51, as well as the above halftone mask 11, further includes a light-blocking layer portion 53a located around the transflective regions, which provide light intensity difference. The light-blocking layer 53 and the light-blocking layer portion 53a are made of, for example, chromium (Cr). In the case where a resist precursor layer 24 is exposed to light through the slit mask 51, the intensity of light can be reduced to a predetermined value because the slit mask 51 has the opening portions (slits) 52.

Second Variation

In the halftone mask 11, the light-blocking layer portion 14a need not extend along the periphery of the transflective layer 13 and may be located near a necessary portion of the periphery of the transflective layer 13.

What is claimed is:

1. A photomask comprising:
   a first light-blocking section that blocks light;
   a second light-blocking section that blocks light;
   a first light intensity difference section that controls the intensity of light;
   a second light intensity difference section that controls the intensity of light;
   a first light-transmissive region that transmits light; and
   a second light-transmissive region that transmits light,
   wherein the first light-blocking section is disposed between the first light intensity difference section and the first light-transmissive region,
   the second light-blocking section is disposed between the first light intensity difference section and the second light intensity difference section, and
   the first and second light intensity difference sections are disposed between the first and the second light-transmissive regions.

2. The photomask according to claim 1, wherein the first light intensity difference section is halftone.

3. The photomask according to claim 1, wherein the first light intensity difference section has a plurality of slits.

4. A semiconductor device manufactured using the photomask according to claim 1, comprising:
 a semiconductor layer disposed on a substrate;
 a source region formed by heavily implanting an impurity into a portion of the semiconductor layer; and
 a drain region formed by heavily implanting the impurity into a portion of the semiconductor layer,
 wherein the semiconductor layer has a region which extends around the source and drain regions and which is undoped with the impurity and the concentration of the impurity decreases from substantially the center of each of the source and drain regions toward the periphery thereof.

5. The semiconductor device according to claim 4, wherein the source and drain regions are surrounded by circular regions depending on the difference in impurity concentration.

6. A method for manufacturing a semiconductor device using the photomask according to claim 1, comprising:
 forming a semiconductor layer on a substrate;
 forming a resist precursor layer on the semiconductor layer;
 irradiating the resist precursor layer with exposure light through the photomask placed above the resist precursor layer;
 developing the resist precursor layer into a resist layer; and
 processing the semiconductor layer using the resist layer.

7. The photomask according to claim 1, wherein the second light intensity difference section is halftone.

8. The photomask according to claim 1, wherein the second light intensity difference section has a plurality of slits.

9. The photomask according to claim 1, wherein a third light-blocking section that blocks light is disposed between the second light intensity difference section and the second light-transmissive region that transmits light.

* * * * *